United States Patent
Du

(10) Patent No.: US 10,425,588 B2
(45) Date of Patent: Sep. 24, 2019

(54) IMAGING CONTROL METHODS AND APPARATUSES FOR DIGITAL IMAGE COLLECTION

(71) Applicant: BEIJING ZHIGU TECH CO., LTD., Beijing (CN)

(72) Inventor: Lin Du, Beijing (CN)

(73) Assignee: BEIJING ZHIGU TECH CO., LTD., Beijing (CN)

(*) Notice: Subject to any disclaimer, the term of this patent is extended or adjusted under 35 U.S.C. 154(b) by 181 days.

(21) Appl. No.: 15/507,942

(22) PCT Filed: Aug. 26, 2015

(86) PCT No.: PCT/CN2015/088096
§ 371 (c)(1),
(2) Date: Mar. 1, 2017

(87) PCT Pub. No.: WO2016/034060
PCT Pub. Date: Mar. 10, 2016

(65) Prior Publication Data
US 2017/0289459 A1   Oct. 5, 2017

(30) Foreign Application Priority Data
Sep. 3, 2014  (CN) .......................... 2014 1 0446152

(51) Int. Cl.
*H04N 5/232* (2006.01)
*H04N 5/345* (2011.01)
(Continued)

(52) U.S. Cl.
CPC ... *H04N 5/23296* (2013.01); *H01L 27/14601* (2013.01); *H01L 27/14607* (2013.01);
(Continued)

(58) Field of Classification Search
CPC .. H04N 5/23296; H04N 5/2628; H04N 5/335; H04N 5/3454; H04N 5/3696; H04N 5/232; H01L 27/14601; H01L 27/14607
See application file for complete search history.

(56) References Cited

U.S. PATENT DOCUMENTS 8,654,152 B2  2/2014 McEldowney et al.
2008/0151089 A1  6/2008 Street et al.
(Continued)

FOREIGN PATENT DOCUMENTS

CN  102201422 A  9/2011
CN  102332090 A  1/2012
(Continued)

OTHER PUBLICATIONS

International Search Report and Written Opinion for Application No. PCT/CN2015/088096, dated Oct. 23, 2015, 8 pages.

*Primary Examiner* — Yogesh K Aggarwal
(74) *Attorney, Agent, or Firm* — Sheppard Mullin Richter & Hampton LLP

(57) ABSTRACT

Embodiments of the subject application disclose various imaging control methods and apparatuses for a digital zoom image and various imaging devices. One of imaging control methods for a digital zoom image comprises: acquiring a digital zoom parameter; determining an actual imaging area of an image sensor according to the acquired digital zoom parameter; adjusting a pixel density distribution of the image sensor, to cause an average pixel density of the actual imaging area after adjustment to become greater than those of other areas of the image sensor; and acquiring, by using the actual imaging area with the adjusted average pixel density, an image of a scene to be photographed. The technical solutions provided in the embodiments of the subject application cause that as many as possible pixels of the image sensor gather at an actual imaging area corre- (Continued)

sponding to a digital zoom parameter to participate in image collection, thereby improving efficiency of image collection and the definition of a collected image.

22 Claims, 8 Drawing Sheets

(51) Int. Cl.
*H04N 5/369* (2011.01)
*H01L 27/146* (2006.01)
*H04N 5/262* (2006.01)
*H04N 5/335* (2011.01)

(52) U.S. Cl.
CPC ........... *H04N 5/2628* (2013.01); *H04N 5/335* (2013.01); *H04N 5/3454* (2013.01); *H04N 5/3696* (2013.01); *H04N 5/232* (2013.01)

(56) References Cited

U.S. PATENT DOCUMENTS

| | | |
|---|---|---|
| 2009/0122162 A1 | 5/2009 | Shabtay et al. |
| 2011/0310125 A1* | 12/2011 | McEldowney ......... G06F 3/017 345/660 |
| 2014/0111680 A1 | 4/2014 | Sutton et al. |
| 2014/0118526 A1 | 5/2014 | Sutton et al. |

FOREIGN PATENT DOCUMENTS

| | | |
|---|---|---|
| CN | 102984820 A | 3/2013 |
| CN | 104301605 A | 1/2015 |
| JP | 2006-129411 A | 5/2006 |

* cited by examiner

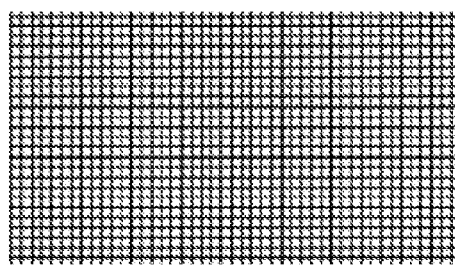 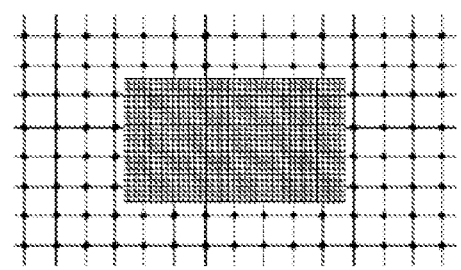
FIG. 2a  FIG. 2b
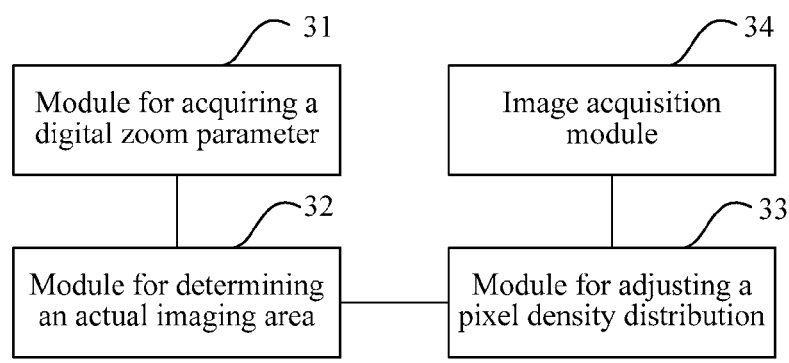
FIG. 3

IMAGING CONTROL METHODS AND APPARATUSES FOR DIGITAL IMAGE COLLECTION

CROSS-REFERENCE TO RELATED APPLICATIONS

This application is a national phase application of International Application No. PCT/CN2015/088096, filed on Aug. 26, 2015, which claims the benefit of priority to Chinese Patent Application No. 201410446152.4, filed on Sep. 3, 2014, and entitled "Imaging Control Methods and Apparatuses for a Digital Zoom Image and Imaging Devices," each of which is incorporated herein by reference in its entirety.

TECHNICAL FIELD

The subject application relates to the field of imaging technologies, and in particular, to various imaging control methods and apparatuses for facilitating digital image collection.

BACKGROUND

Zoom is one of the important capabilities of a lens of an imaging device such as a camera or a video camera.

The so-called zoom mainly comprises optical zoom and digital zoom. Both optical zoom and digital zoom help to enlarge an object from far away during telephotographing. However, optical zoom can support addition of more pixels after imaging of an image subject, and therefore, not only a formed image of the image subject becomes larger, but also the formed image has higher definition. Digital zoom generally crops the size of an originally collected image, and makes the collected image larger on a display screen, but details of an image formed after zooming does not become clearer.

SUMMARY

A technical problem to be solved by the various embodiments is to provide an image control apparatus and method, which enables improvement in efficiency of image collection and in the definition of a collected image.

Brief description related to the subject application is provided below to provide basic understanding of some aspects of the subject application. It should be understood that such description is not exhaustive description of the subject application, and is not intended to decide critical or important parts of the subject application, and is also not intended to limit the scope of the subject application. The objective of such description is merely to provide some concepts in simplified forms and use these concepts as a preface for further detailed description in subsequent discussion.

The subject application provides various imaging control methods and apparatuses for a digital zoom image and various imaging devices.

In an aspect, an embodiment of the subject application provides an imaging control method for a digital zoom image, comprising:

acquiring a digital zoom parameter;

determining an actual imaging area of an image sensor according to the acquired digital zoom parameter;

adjusting a pixel density distribution of the image sensor, to cause that an average pixel density of the actual imaging area after adjustment is greater than those of other areas of the image sensor; and acquiring, using the actual imaging area with the adjusted average pixel density, an image of a scene to be photographed.

In another aspect, an embodiment of the subject application further provides an imaging control apparatus, comprising:

a digital zoom parameter acquisition module configured to acquire a digital zoom parameter;

an actual imaging area determination module configured to determine an actual imaging area of an image sensor according to the acquired digital zoom parameter;

a pixel density distribution adjustment module configured to adjust a pixel density distribution of the image sensor, to cause an average pixel density of the actual imaging area after adjustment to become greater than those of other areas of the image sensor; and an image acquisition module configured to acquire, by using the actual imaging area with the adjusted average pixel density distribution, an image of a scene to be photographed.

In still another aspect, an embodiment of the subject application provides an imaging device, comprising an image sensor and an imaging control apparatus in the foregoing, where the imaging control apparatus is connected to the image sensor.

For the technical solutions provided in the embodiments of the subject application, a pixel density distribution of an image sensor is adjusted according to an actual imaging area corresponding to a digital zoom parameter, to cause that an average pixel density of the actual imaging area of the image sensor is greater than average pixel densities of other areas of the image sensor, that is, the total number of pixels of the actual imaging area of the image sensor after adjustment is greater than the total number of pixels of an area corresponding to the actual imaging area of the image sensor before adjustment, that is, to cause that in a process of imaging control based on a digital zoom technology, the embodiments of the subject application cause that as many as possible pixels of the image sensor gather at the actual imaging area to participate in image collection, thereby improving efficiency of image collection and the definition of a collected image.

By means of the detailed description of optional embodiments of the subject application below with reference to the accompanying drawings, these and other advantages of the subject application become clearer.

BRIEF DESCRIPTION OF THE DRAWINGS

The present disclosure may be better understood by means of the description below with reference to the accompanying drawings, where in all the accompanying drawings, same or similar reference numerals are used to represent same or similar members. The accompanying drawings and the detailed description below together are comprised in the specification and form a part of the specification, and used to further exemplify optional embodiments of the subject application and explain principles and advantages of the subject application. In the accompanying drawings:

FIG. 2a is an example of a pixel density distribution of an image sensor according to an embodiment of the subject application;

FIG. 2b is an example of a pixel density distribution of an image sensor after adjustment according to an embodiment of the subject application;

FIG. 3 is a structural block diagram of an imaging control apparatus according to an embodiment of the subject application;

Figure 1A:
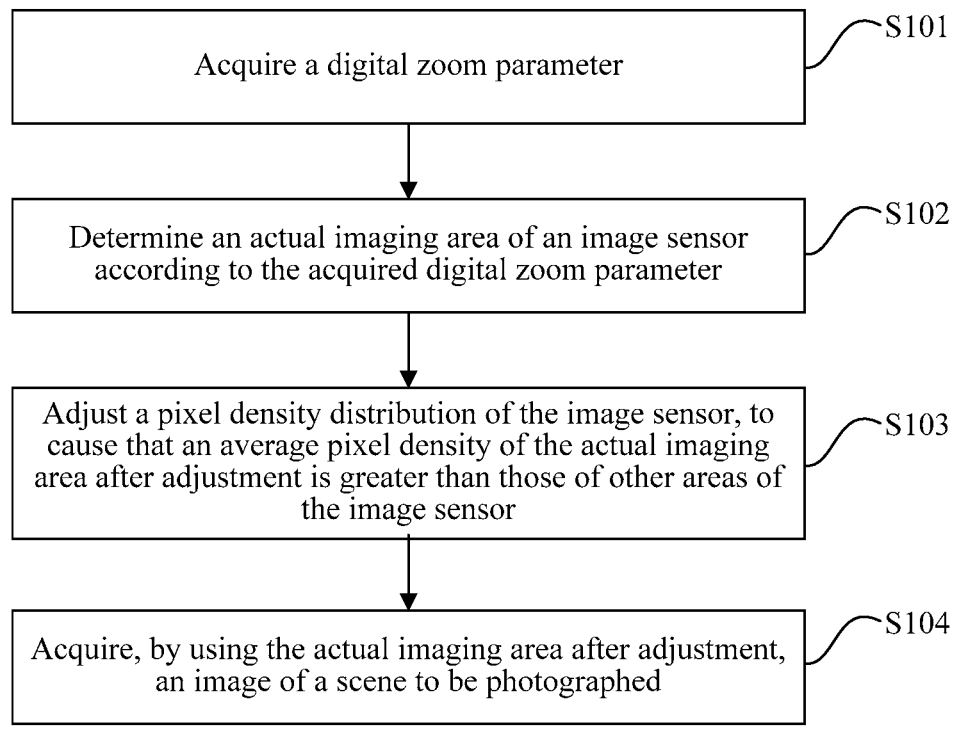
FIG. 1a is a flowchart of an imaging control method for a digital zoom image according to an embodiment of the subject application.

A person skilled in the art should understand that elements in the accompanying drawings are merely shown for simplicity and clarity, and are not necessarily drawn in proportion. For example, the sizes of some elements in the accompanying drawings may be enlarged relative to other elements, which are provided to improve understanding of the embodiments of the subject application.

DETAILED DESCRIPTION

Exemplary embodiments of the subject application are described in detail below with reference to the accompanying drawings. For clarity and simplicity, all features of actual implementation manners are not described in the specification. However, it should be understood that many decisions specific to the implementation manners must be made in a process of developing any such actual embodiments, so as to achieve a specific objective of a developer. For example, those constraints related to systems and services are met, and these constraints may vary by different implementation manners. In addition, it should further be understood that although development work may be very complicated and time consuming, for a person skilled in the art that benefits from the disclosed content, such development work is merely a routine task.

Here, it should be noted that to prevent unnecessary details from blurring the subject application, only apparatus structures and/or processing steps closely related to solutions according to the subject application are described in the accompanying drawings and description, and representation and description of members and processing that are not closely related to the subject application and are known to a person of ordinary skill in the art are omitted.

Specific implementations of the subject application are further described in detail below with reference to the accompanying drawings (in which like elements are denoted by like reference numerals) and embodiments. The following embodiments are intended to describe the subject application, but not to limit the scope of the subject application.

A person skilled in the art may understand that terms such as "first" and "second" in the subject application are only for distinguishing different steps, devices or modules, and do not represent any specific technical meanings and do not represent certain logic sequences among the steps, devices or modules.

FIG. 1a is a flowchart of an imaging control method for a digital zoom image provided in an embodiment of the subject application. An execution body of the imaging control method provided in the embodiments of the subject application may be an imaging control apparatus, and the imaging control apparatus may perform, by executing the imaging control method, imaging control on a still or moving image in an application process comprising, but not limited to, photo taking, video recording, photographing, and video monitoring. A device presentation form of the imaging control apparatus is not limited. For example, the imaging control apparatus may be a standalone apparatus, and the apparatus coordinates and communicates with an imaging device comprising an image sensor. Alternatively, the imaging control apparatus may be integrated, as a functional module, in an imaging device comprising an image sensor, which is not limited in the embodiments of the subject application.

Specifically, as shown in FIG. 1a, an imaging control method for a digital zoom image provided in an embodiment of the subject application comprises:

S101: Acquire a digital zoom parameter.

The digital zoom parameter may comprise, but is not limited to, a data zoom factor.

S102: Determine an actual imaging area of an image sensor according to the acquired digital zoom parameter.

After the digital zoom parameter is acquired, an actual imaging area of the sensor may be determined according to the acquired digital zoom factor. For example, the data zoom parameter comprises a digital zoom factor X, and therefore the center of the actual imaging area of the image sensor is the center of the image sensor, and the size of the actual imaging area is 1/X times of the original size of the image sensor.

S103: Adjust a pixel density distribution of the image sensor, to cause an average pixel density of the actual imaging area after adjustment to be greater than those of other areas of the image sensor.

An image sensor in the embodiments of the subject application is an image sensor with an adjustable pixel density, and may comprise, but is not limited to, a flexible image sensor. The flexible image sensor comprises a flexible substrate and multiple image sensor pixels formed on the flexible substrate. When meeting a particular condition, the flexible substrate may change, for example, extend or contract or bend to adjust a pixel density distribution of the flexible image sensor. According to such a characteristic of an adjustable pixel density distribution of the image sensor, in the embodiments of the subject application, the pixel density distribution of the image sensor is adjusted, to cause that an average pixel density of an actual imaging area of the image sensor is greater than average pixel densities of other areas of the image sensor.

S104: Acquire, by using the actual imaging area after adjustment, an image of a scene to be photographed.

In a process of imaging control based on a digital zoom technology, pixels of the actual imaging area of the image sensor participate in image collection, and pixels of other areas of the image sensor do not participate in image collection.

For the embodiments of the subject application, a pixel density distribution of an image sensor is adjusted according to an actual imaging area corresponding to a digital zoom parameter, to cause that an average pixel density of the actual imaging area of the image sensor is greater than average pixel densities of other areas of the image sensor, that is, the total number of pixels of the actual imaging area of the image sensor after adjustment is greater than the total number of pixels of an area corresponding to the actual imaging area of the image sensor before adjustment, that is, to cause that in a process of imaging control based on a digital zoom technology, the embodiments of the subject application causes that as many as possible pixels of the image sensor gather at the actual imaging area to participate in image collection, thereby improving efficiency of image collection and the definition of a collected image.

In the foregoing technical solutions, a method for adjusting a pixel density distribution of the image sensor may be determined according to an actual need, which is not limited in the embodiments of the subject application.

In some embodiments, the adjusting a pixel density distribution of the image sensor comprises: determining target pixel density distribution information according to the pixel adjustment constraint information and the actual imaging area corresponding to the acquired digital zoom parameter, wherein an average target pixel density corresponding to the actual imaging area in the determined target pixel density distribution information is greater than average target pixel densities corresponding to the other areas; and adjusting the pixel density distribution of the image sensor according to the determined target pixel density distribution information. The target pixel density distribution information corresponding to the digital zoom parameter is generally used for representing a relative expectation of a user or a device for a presentation effect of a finally acquired image of the actual imaging area corresponding to the digital zoom parameter, actual imaging areas of image sensors corresponding to different digital zoom parameters have different sizes, and target pixel density distribution information of corresponding actual imaging areas is also not same. Therefore, in the solution, the pixel density distribution of the image sensor is adjusted according to the target pixel density distribution information corresponding to the acquired digital zoom parameter, to cause that the pixel density distribution of the image sensor is the same as the target pixel density distribution information, or approximates the target pixel density distribution information, thereby meeting that a high definition image having a corresponding digital zoom effect is obtained under different digital zoom parameters. Pixels corresponding to the actual imaging area in the target pixel density distribution information are evenly distributed, to cause that an image acquired by using the actual imaging area has even definition. Alternatively, pixels corresponding to the actual imaging area in the target pixel density distribution information are unevenly distributed. For example, a local pixel density is large and a local pixel density is small or a pixel density starts to present, from the central position, gradient distribution having a particular rule, to cause that the definition of an image acquired by using the actual imaging area presents differentiated distribution, and the image is locally clear and locally unclear, thereby better meeting varied actual application demands of users.

Furthermore, in the embodiments of the subject application, a manner of determining the target pixel density distribution information corresponding to the acquired digital zoom parameter is very flexible. For example, a mapping between a digital zoom parameter and target pixel density distribution information may be acquired; and the target pixel density distribution information corresponding to the acquired digital zoom parameter is determined according to the mapping. The solution helps to improve efficiency of adjusting a pixel density distribution of an image sensor. The mapping may be recorded in a manner of (but not limited to) a table. An optional comparison example is shown in Table 1 and Table 2:

TABLE 1

Pixel density distribution when a digital zoom factor X = 1 (without digital zoom)

| X-axis pixel index number | Y-axis pixel index number | X-axis pixel position coordinate | Y-axis pixel position coordinate |
| --- | --- | --- | --- |
| 1 | 1 | 1 | 1 |
| 2 | 1 | 2 | 1 |
| ... | ... | ... | ... |
| 200 | 150 | 200 | 150 |
| 201 | 150 | 201 | 150 |
| ... | ... | ... | ... |
| m | N | m | n |

For an image sensor of m rows×n columns, an X axis and a Y axis represent two coordinate axes of the image sensor, the image sensor comprises multiple pixels distributed in an array, and each pixel has two sets of labels in the image sensor. One set of labels are index numbers, that is, an X-axis pixel index number and a Y-axis pixel index number, which are used for representing which row and which column a current pixel specifically is. The other set of labels are position coordinates, that is, an X-axis pixel position coordinate and a Y-axis pixel position coordinate, which are used for representing a specific physical position of a current pixel in the image sensor. Table 1 shows correspondences between index numbers and position coordinates of image sensor pixels in a case where the image sensor does not have digital zoom (X=1, adjustment of a pixel density distribution is not performed). In a case of digital zoom, the actual imaging area of the image sensor is the entire image sensor, and all pixels of the image sensor participate in image collection.

TABLE 2

Pixel density distribution when a digital zoom factor X = 2 (digital zoom)

| X-axis pixel index number | Y-axis pixel index number | X-axis pixel position coordinate | Y-axis pixel position coordinate |
|---|---|---|---|
| 1 | 1 | 1 | 1 |
| 2 | 1 | 5 | 1.8 |
| ... | ... | ... | ... |
| 200 | 150 | 300.02 | 230.1 |
| 201 | 150 | 300.58 | 230.1 |
| ... | ... | ... | ... |
| m | N | M | n |

Table 2 shows correspondences between index numbers and position coordinates of the image sensor pixels in a case of digital zoom (for example, X=2, adjustment of a pixel density distribution is performed), where an X-axis pixel position coordinate and a Y-axis pixel position coordinate are actual position coordinates of the image sensor pixels after adjustment of pixel density, that is, the target pixel density distribution information corresponding to the digital zoom parameter (for example, a digital zoom factor X=2). It may be found by comparing Table 1 and Table 2 that in a case of digital zoom (for example, X=2), a pixel distribution of the central area of the image sensor is relatively dense, and a pixel distribution in a peripheral area is relatively sparse, that is, in a case of digital zoom, the average pixel density of the actual imaging area of the image sensor is relatively large. In a case of digital zoom, the actual imaging area of the image sensor is an area that uses the image sensor as the center and occupies 1/X times of the image sensor. For example, a digital zoom factor is X=2, and the actual imaging area is an area that uses the center of the image sensor as the center and occupies ½ times of the image sensor. The pixels in the actual imaging area participate in image collection, and pixels in areas other than the actual imaging area in the image sensor do not participate in image collection. The pixel density distribution of the image sensor is adjusted according to the target pixel density distribution information determined through the foregoing mapping, so that adjustment efficiency is high, and an image, of a scene to be photographed, collected by using the actual imaging area of the image sensor after adjustment of the pixel density distribution has relatively high definition.

In some embodiments, the adjusting a pixel density distribution of the image sensor comprises: acquiring pixel adjustment constraint information of the image sensor; determining target pixel density distribution information according to the pixel adjustment constraint information and the actual imaging area; and adjusting the pixel density distribution of the image sensor according to the determined target pixel density distribution information. The pixel adjustment constraint information is used for representing subjective constraints or objective extreme constraints on pixel adjustment caused by factors such as a user or a material attribute of the image sensor. For example, the pixel adjustment constraint information may comprise, but is not limited to, an adjustable flexible range between any two adjacent pixels of the image sensor. If a pitch between any two adjacent pixels of the image sensor is adjusted according to the adjustable flexible range, when an effect of an external field that is applied on the image sensor and is for adjusting the pixel density distribution of the image sensor is canceled, the pixel density distribution of the image sensor may be restored to an originally unadjusted state. A minimum value of the adjustable flexible range is an adjustable minimum pitch between any two adjacent pixels of the image sensor, and a maximum value of the adjustable flexible range is an adjustable maximum pitch between any two adjacent pixels of the image sensors. In the solution, target pixel density distribution information is determined according to the pixel adjustment constraint information and the actual imaging area, and pixel density distribution of an image sensor is adjusted according to the determined target pixel density distribution information, to cause that a pitch between pixels may be flexibly adjusted within an effective flexible range according to an actual need without damaging an image sensor, thereby meeting varied actual demands of users.

Furthermore, an average pitch between any two adjacent pixels corresponding to the other areas in the target pixel density distribution information is a first value, and the first value is any value, greater than a pixel pitch average value of the image sensor, in the flexible range. For example, in a case where it is met that a pitch between any two adjacent pixels in the actual imaging area of the image sensor is greater than or equal to a minimum value of the flexible range, the first value may be the maximum value of the flexible range, that is, a pitch between any two adjacent pixels in areas other than the actual imaging area of the image sensor is adjusted to be the maximum value of the flexible range, and pixels corresponding to the actual imaging area in the target pixel density distribution information are evenly distributed or unevenly distributed. The solution can improve efficiency of adjusting a pixel density distribution, and cause that the actual imaging area can obtain a pixel density distribution having a maximum density, thereby helping to obtain a digital zoom image having higher definition.

In the embodiments of the subject application, after target pixel density distribution information of an image is acquired, a pixel density distribution of an image sensor may be adjusted according to the target pixel density distribution information. A schematic diagram of the pixel density distribution of the image sensor before adjustment is shown in FIG. 2a, a schematic diagram after adjustment is shown in FIG. 2b, and the image sensor after adjustment has a large local pixel density and a small local pixel density. In actual applications, a manner of adjusting the pixel density distribution of the image sensor may be selected according to an actual need, which is not limited in the embodiments of the subject application. In an optional implementation manner, deformation control information of a deformation-controllable material portion may be determined according to the target pixel density distribution information; and deformation of the deformation-controllable material portion is controlled according to the deformation control information, so as to correspondingly adjust the pixel density distribution of the image sensor by using the deformation of the deformation-controllable material portion. In the solution, deformation of a deformation-controllable material portion is controlled to adjust a pixel distribution of the image sensor, and the solution is simple and is easy to implement.

The deformation-controllable material portion may deform by changing an external effect factor (for example, an external field) applied on the deformation-controllable material portion, and when an external field applied on the deformation-controllable material portion is canceled or changed, the deformation-controllable material portion may be restored from the deformation.

Figure 1B:
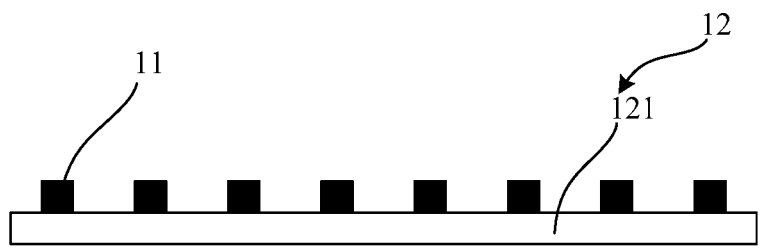
FIG. 1b is a schematic structural diagram of an image sensor with an adjustable pixel density according to an embodiment of the subject application.

FIG. 1b is a schematic structural diagram of an image sensor with an adjustable pixel density provided in an embodiment of the subject application. As shown in FIG. 1b, the image sensor with an adjustable pixel density provided in the embodiments of the subject application comprises: multiple image sensor pixels 11 and a deformation-controllable material portion 12. The image sensor performs image collection by using the image sensor pixels 11, the multiple image sensor pixels 11 are distributed in an array, and the deformation-controllable material portion 12 is separately connected to the multiple image sensor pixels 11. The deformation-controllable material portion 12 is deformable under an effect of an external field, and a density distribution of the multiple image sensor pixels 11 is correspondingly adjusted by using the deformation of the deformation-controllable material portion 12.

In the technical solution provided in the embodiments of the subject application, a deformation-controllable material portion may deform by changing an effect of an external field factor on the deformation-controllable material portion. When the effect factor of the external field is canceled or changed, the deformation-controllable material portion may be restored from the deformation. For the external field, a corresponding control external field applied on the deformation-controllable material portion may be selected according to a deformation characteristic of the deformation-controllable material portion. For example, the external field comprises, but is not limited to, an external electric field, magnetic field, and light field. An image sensor pixel may comprise, but is not limited to, at least one photoelectric conversion unit. Each image sensor pixel and a deformation-controllable material portion may be tightly connected in a manner of (but not limited to) adhesion. In this way, when a deformation-controllable material portion deforms, a pitch between image sensor pixels is correspondingly adjusted, thereby changing a density distribution of the image sensor pixels, so as to achieve an effect of providing different areas of an image sensor with differentiated pixel density distributions according to an actual need.

In some cases, an unevenly distributed external field may be applied on different areas of the deformation-controllable material portion, to cause that deformation of different degrees occur at areas of different parts of the deformation-controllable material portion, thereby adjusting an entire density distribution of image sensor pixels. Optionally, the external field may be applied on non-overlapping areas of the deformation-controllable material portion and the multiple image sensor pixels, so as to cause that deformation does not occur at overlapping areas of the deformation-controllable material portion and the image sensor pixels, and instead deformation at other parts of the deformation-controllable material portion is used to change a density distribution of the image sensor pixels. The solution helps to prevent deformation of a deformation-controllable material portion from causing damages to the image sensor pixels.

In some cases, at least one suitable deformation-controllable material may be selected according to a need to make the deformation-controllable material portion, to cause that the deformation-controllable material portion has characteristics of being deformable and restorable from deformation. Optionally, the deformation-controllable material portion is made of at least one or more of the following deformation-controllable materials: a piezoelectric material, an electroactive polymer, a photo-deformable material, and a magnetostrictive material.

The piezoelectric material may generate mechanical deformation under an effect of an electric field. A deformation-controllable material portion made by using the piezoelectric material is referred to as a piezoelectric material portion below. Such a physical characteristic of the piezoelectric material is used, so that in the embodiments of the subject application, electric field control information required to enable corresponding mechanical deformation to occur at the piezoelectric material portion may be determined according to (but not limited to) the target pixel density distribution information, an electric field applied on the piezoelectric material portion is controlled according to the electric field control information, to cause that the corresponding mechanical deformation occurs at the piezoelectric material portion, and the mechanical deformation of the piezoelectric material portion is used to correspondingly adjust a pixel density distribution of an image sensor, thereby achieving an objective of adjusting the pixel density distribution of the image sensor according to the target pixel density distribution information. The piezoelectric material may comprise, but is not limited to, at least one of the following: piezoelectric ceramic and piezoelectric crystal. In the solution, a physical characteristic of a piezoelectric material may be fully used to adjust a pixel density distribution of an image sensor.

Electroactive polymers (EAP) are a type of polymer materials whose shapes or sizes can change under an effect of an electric field. A deformation-controllable material portion made of the electroactive polymer is referred to as an electroactive polymer portion below. Such a physical characteristic of the electroactive polymer is used, so that in the embodiments of the subject application, electric field control information required to enable corresponding deformation to occur at the electroactive polymer portion may be determined according to (but not limited to) the target pixel density distribution information, an electric field applied on an electroactive polymer layer is controlled according to the electric field control information, to cause that corresponding deformation occurs at the electroactive polymer layer, and the deformation of the electroactive polymer layer is used to correspondingly adjust a pixel density distribution of an image sensor, thereby achieving an objective of adjusting the pixel density distribution of the image sensor according to the target pixel density distribution information. The electroactive polymer may comprise, but is not limited to, at least one of the following: an electron electroactive polymer and an ion electroactive polymer. The electron electroactive polymer comprises at least one of the following: a ferroelectric polymer (for example, polyvinylidene fluoride), an electrostrictive graft elastomer, and a liquid crystal elastomer. The ion electroactive polymer comprises at least one of the following: an electrorheological fluid, an ion polymer-metal composite material, and the like. In the solution, a physical characteristic of an electroactive polymer may be fully used to adjust a pixel density distribution of an image sensor.

The photo-deformable material is a type of macromolecular materials whose shapes or sizes can change under an effect of a light field. A deformation-controllable material portion made of the photo-deformable material is referred to as a photo-deformable material portion below. Such a physical characteristic of the photo-deformable material, so that in the embodiments of the subject application, light field control information required to enable corresponding deformation to occur at the photo-deformable material portion may be determined according to (but not limited to) the target pixel density distribution information, and a light field applied on the photo-deformable material portion is controlled according to the light field control information, to cause that the corresponding deformation occurs at the photo-deformable material portion. The deformation of the photo-deformable material portion is used to correspondingly adjust a pixel density distribution of an image sensor, thereby achieving an objective of adjusting the pixel density distribution of the image sensor according to the target pixel density distribution information. The photo-deformable material may comprise, but is not limited to, at least one of the following: photostrictive ferroelectric ceramic, and a photo-deformable polymer. The photostrictive ferroelectric ceramic comprises, but is not limited to, Perovskite Lead Lanthanum Zirconate Titanate (PLZT) ceramic. The photo-deformable polymer comprises, but is not limited to, a photo-deformable liquid crystal elastomer. In the solution, a physical characteristic of a photo-deformable material may be fully used to adjust a pixel density distribution of an image sensor.

The magnetostrictive material is a type of magnetic materials whose magnetization state can change and further whose size is changed under an effect of magnetic field. A deformation-controllable material portion made of a magnetic deformable material is referred to as a magnetic deformable material portion. Such a physical characteristic of the magnetostrictive material is used, so that in the embodiments of the subject application, magnetic field control information required to enable corresponding deformation to occur at the magnetostrictive material may be determined according to (but not limited to) the target pixel density distribution information, and a magnetic field applied on the magnetic deformable material portion is controlled according to the magnetic field control information, to cause that the corresponding deformation occurs at the magnetic deformable material portion. Deformation of the magnetic deformable material portion is used to correspondingly adjust a pixel density distribution of an image sensor, thereby achieving an objective of adjusting the pixel density distribution of the image sensor according to the target pixel density distribution information. The magnetic deformable material may comprise, but is not limited to, a rare-earth super-magnetostrictive material, for example, an alloy $Tbo_{0.3}Dy_{0.7}Fe_{1.95}$ material that uses a $(Tb,Dy)Fe_2$ compound as a base. In the solution, a physical characteristic of a magnetic deformable material may be fully used to adjust a pixel density distribution of an image sensor.

In the technical solution provided in the embodiments of the subject application, specific structures and connection manners of image sensor pixels and a deformation-controllable material portion may be determined according to an actual need, and an actual manner is very flexible.

In some embodiments, as shown in FIG. 1b, the deformation-controllable material portion 12 comprises: a deformation-controllable material layer 121, and the multiple image sensor pixels 11 that are distributed in an array and connected to a surface of the deformation-controllable material layer 121. Optionally, it may be selected according to an actual process condition that the multiple image sensor pixels are directly formed on the deformation-controllable material layer 121, or, the multiple image sensor pixels and the deformation-controllable material layer 121 may be separately made and the two can be tightly connected in a manner of (but not limited to) adhesion. The solution has a simple structure and is easy to implement.

Figure 1C:
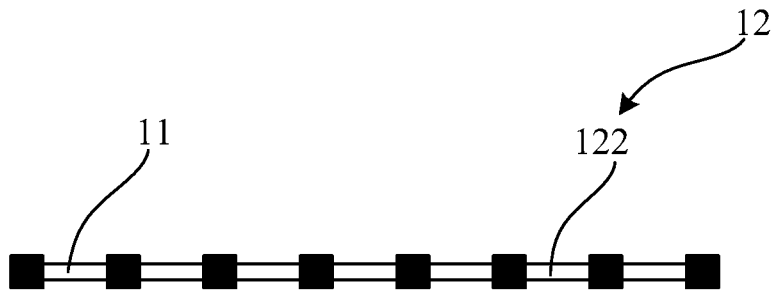
FIG. 1c is a schematic structural diagram of an image sensor with an adjustable pixel density according to an embodiment of the subject application.

In another optional implementation manner, as shown in FIG. 1c, the deformation-controllable material portion 12 comprises multiple deformation-controllable material connecting sub-portions 122, and the multiple deformation-controllable material connecting sub-portions 122 are distributed in an array to be correspondingly connected to the multiple image sensor pixels 11 distributed in an array, that is, the multiple image sensor pixels distributed in an array and the multiple deformation-controllable material connecting sub-portions distributed in an array are connected together. Optionally, the multiple deformation-controllable material connecting sub-portions may be formed at interval areas of pixels of pixel arrays of an image sensor according to an actual process, and the multiple deformation-controllable material connecting sub-portions and corresponding image sensor pixels may be connected in a manner of (but not limited to) abutting and bonding. A density distribution of image sensor pixels may be adjusted by controlling deformation of multiple deformation-controllable material connecting sub-portions, and the structure is simple and is easy to implement.

Figure 1D:
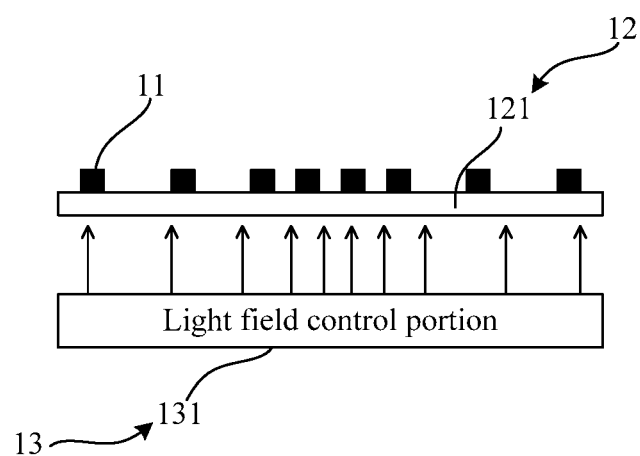
FIG. 1d is a schematic structural diagram of an image sensor with an adjustable pixel density according to an embodiment of the subject application.
Figure 1E:
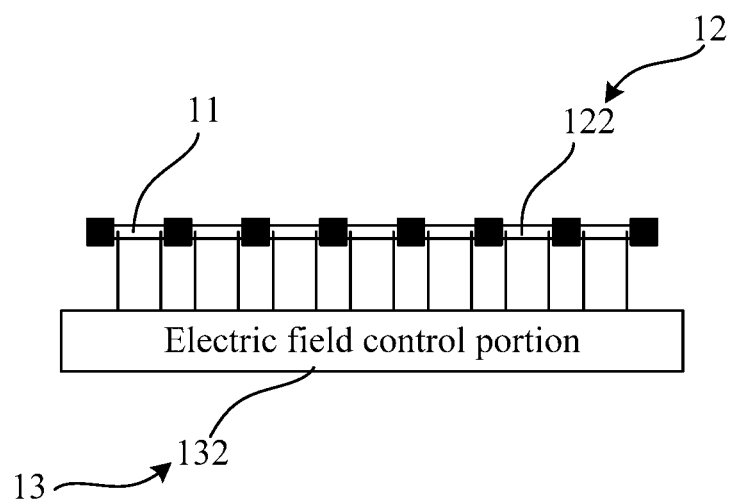
FIG. 1e is a schematic structural diagram of an image sensor with an adjustable pixel density according to an embodiment of the subject application.

Further, as shown in FIG. 1d and FIG. 1e, the image sensor may further comprise: a deformation control portion 13, where the deformation control portion 13 is for adjusting the distribution of the external field applied on the deformation-controllable material portion 12, so as to control corresponding deformation of the deformation-controllable material portion 12. In this way, when the deformation-controllable material portion 12 deforms, a pitch between the image sensor pixels 11 is correspondingly adjusted, thereby changing a density distribution of the image sensor pixels 11, so as to achieve an effect of providing different areas of an image sensor with differentiated pixel density distributions according to an actual need.

Optionally, as shown in FIG. 1d, the deformation control portion may comprise a light field control portion 131, and the light field control portion 131 is for adjusting a distribution of an external light field applied on the deformation-controllable material portion 12, so as to control corresponding deformation of the deformation-controllable material portion 12. In this case, the deformation-controllable material portion 12 may comprise at least one photo-deformable material portion made of a photo-deformable material. For example, the photo-deformable material portion may comprise at least one photo-deformable material layer made of the photo-deformable material, or, the deformation-controllable material portion may comprise at least multiple photo-deformable material connecting sub-portions made of the photo-deformable material. The light field control portion 131 changes a distribution of a light field (in FIG. 1d, the density of arrows is used to represent a light field, having different intensity distributions, applied on the deformation-controllable material portion 12) applied on the photo-deformable material portion to excite deformation of different degrees to occur at different areas of the deformation-controllable material portion 12, and the deformation of the deformation-controllable material portion 12 is used to correspondingly adjust a pitch between the image sensor pixels 11, thereby changing a density distribution of the image sensor pixels 11, so as to achieve an effect of providing different areas of an image sensor with differentiated pixel density distributions according to an actual need.

Figure 1F:
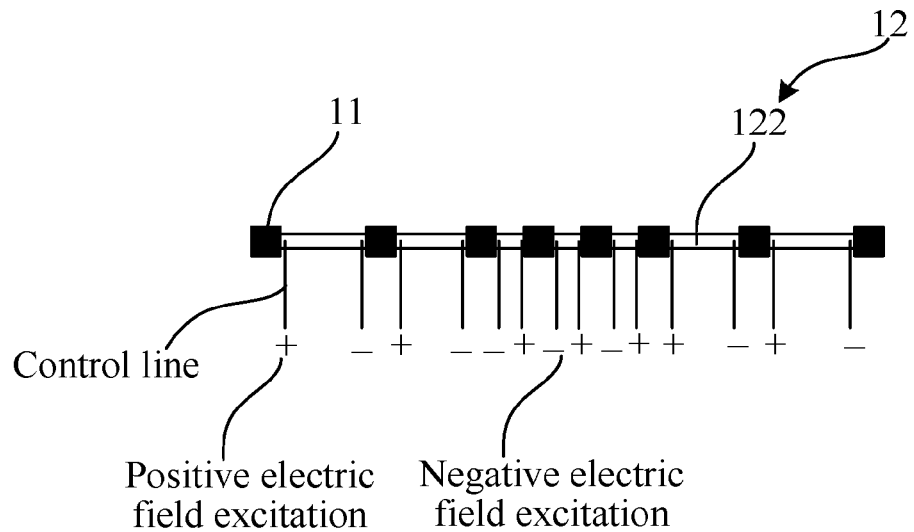
FIG. 1f is an example of a scene in which an image sensor adjusts a pixel density in a case of uneven optical field excitation according to an embodiment of the subject application.

Optionally, as shown in FIG. 1e, the deformation control portion may comprise an electric field control portion 132, where the electric field control portion 132 is for adjusting a distribution of an external electric field applied on the deformation-controllable material portion, so as to control corresponding deformation of the deformation-controllable material portion. In this case, the deformation-controllable material portion 12 may comprise at least one piezoelectric material portion (for example, a piezoelectric material layer or a piezoelectric material connecting sub-portion) made of a piezoelectric material, or, the deformation-controllable material portion 12 may comprise at least one electroactive polymer portion (for example, an electroactive polymer layer or an electroactive polymer connecting sub-portion) made of an electroactive polymer. As shown in FIG. 1e, an electric field control portion and a deformation-controllable material may be connected by using a control line, and the electric field control portion 132 changes a distribution of an electric field applied on the deformation-controllable material portion, to excite deformation of different degrees at different areas of the deformation-controllable material portion 12. If an electric field applied on the deformation-controllable material portion 12 is a zero electric field, the deformation-controllable material portion does not deform (which may be referred to as zero electric field excitation). An intensity distribution of an electric field applied on the deformation-controllable material portion 12 is changed (as shown in the drawing, "+" is positive electric field excitation and "−" determined negative electric field excitation), to cause that electric fields applied on different areas of the deformation-controllable material portion 12 have differentiated intensity, as shown in FIG. 1f. In this case, deformation of different degrees may occur at different areas of the deformation-controllable material portion, and the deformation of the deformation-controllable material portion 12 is used to correspondingly adjust a pitch between the image sensor pixels 11, thereby changing an entire pixel density distribution of an image sensor, so as to achieve an effect of providing different areas of an image sensor with differentiated pixel density distributions according to an actual need.

In the embodiments of the subject application, the deformation-controllable portion and the deformation control portion may be directly connected, or may also be indirectly connected. The deformation control portion may be used as a part of the image sensor, or, the deformation control portion may also be not used as a part of the image sensor, and the image sensor may be connected to the deformation control portion in a manner of reserving a pin, an interface or the like. The external field applied on the deformation-controllable material portion may comprise, but is not limited to, an electric field, a magnetic field, a light field, and the like. Hardware and software structures for generating an electric field, hardware and software structures for generating a magnetic field, a hardware and software structure for generating a light field, and the like may be implemented according to an actual need by using the corresponding prior art, which are no longer elaborated herein in the embodiments of the subject application.

Figure 1G:
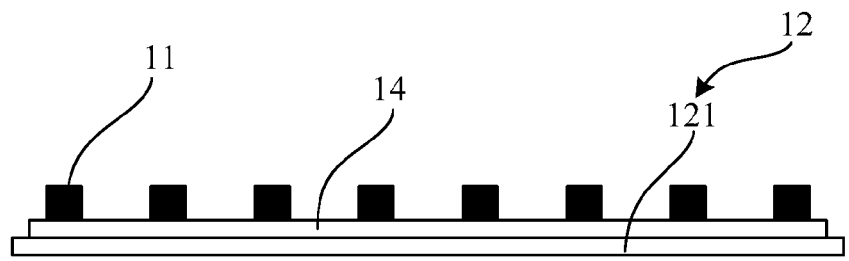
FIG. 1g is a schematic structural diagram of an image sensor with an adjustable pixel density according to an embodiment of the subject application.
Figure 1H:
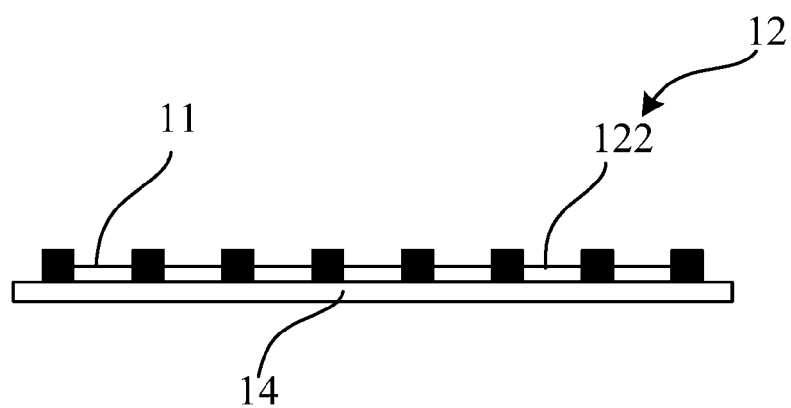
FIG. 1h is a schematic structural diagram of an image sensor with an adjustable pixel density according to an embodiment of the subject application.

Optionally, the image sensor may further comprise a flexible substrate, and the flexible substrate may comprise, but is not limited to, a flexible plastic substrate, which has a particular flexibility. The shape of the flexible substrate may be changed according to a need. The image sensor pixels and the deformation-controllable material portion may be disposed on a same side or different sides of the flexible substrate. For example, as shown in FIG. 1g, the multiple image sensor pixels 11 are connected to a surface of the flexible substrate 14, and a deformation-controllable material portion (for example, a deformation-controllable material layer 121) is connected to the other surface of the flexible substrate 14. For another example, as shown in FIG. 1h, the multiple image sensor pixels 11 are connected to a surface of the flexible substrate 14, and a deformation-controllable material portion (for example, a deformation-controllable material connecting sub-portion 122) is connected to a corresponding image sensor pixel and is located on a same surface of the flexible substrate 14 as the image sensor pixels 11 are located. In the solution, an external field applied on a deformation-controllable material portion can be used to control deformation of the deformation-controllable material portion to indirectly adjust an entire pixel density distribution of an image sensor, thereby implementing that a pixel density is adjustable; moreover, because a flexible substrate is used for the image sensor, the shape of the image sensor may be flexibly changed, for example, a planar image sensor is bent by a particular degree to obtain a curved-surface image sensor, thereby meeting application demands of varied image collection, decoration, and the like.

Figure 1I:
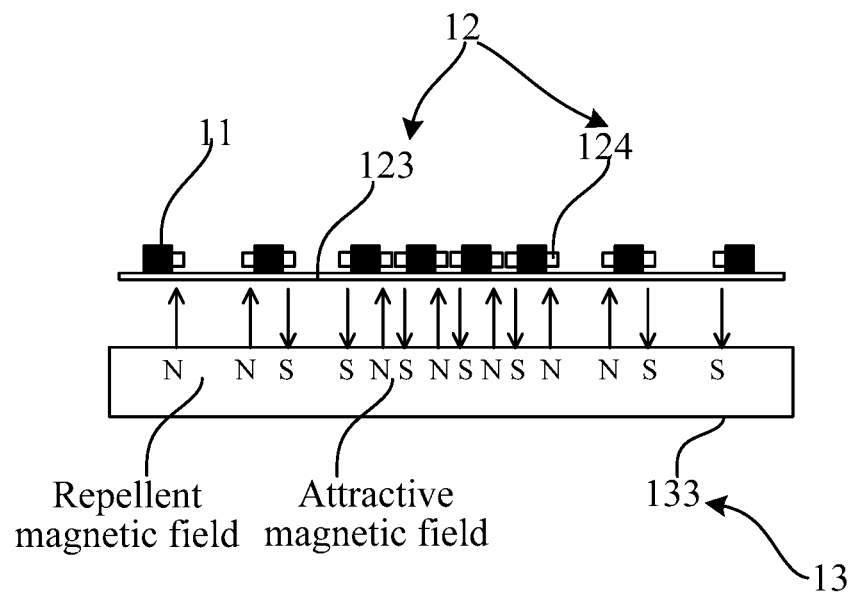
FIG. 1i is a schematic structural diagram of an image sensor with an adjustable pixel density according to an embodiment of the subject application.

FIG. 1i is a schematic structural diagram of a seventh image sensor with an adjustable pixel density provided in an embodiment of the subject application. In the image sensor shown in FIG. 1i, the deformation-controllable material portion 12 comprises: a flexible substrate 123 and multiple permeability material portions 124. The multiple image sensor pixels 11 are separately connected to the flexible substrate 123, multiple permeability material portions 124 are connected on at least a part of the image sensor pixels 11, the magnetic field applied on the permeability material portions 124 is changed to enable corresponding deformation to occur at the flexible substrate 123, and the deformation is used to correspondingly adjust a density distribution of the multiple image sensor pixels 11. For example, a permeability material portion 124 may be disposed on a side surface of each image sensor pixel. Optionally, the image sensor pixels 11 are separately bonded to the flexible substrate 123 and the permeability material portions 124. The permeability material portion may comprise a magnetic pole made of a permeability material. The permeability material may be, but is not limited to, one or more of a soft magnetic material, a silicon steel sheet, a permalloy, a ferrite, a non-crystal soft magnetic alloy, an ultracrystallite soft magnetic alloy, and the like. The permeability material portion made of a soft magnetic material has desirable permeability performance, and after the magnetic field is canceled, remanence is low for ease of adjustment a next time.

Further, optionally, the deformation control portion 13 in the embodiments of the subject application may further comprise: a magnetic field control portion 133. The magnetic field control portion 133 is for adjusting a distribution of an external magnetic field applied on the deformation-controllable material portion, so as to control corresponding deformation of the deformation-controllable material portion. For example, when the magnetic field control portion 133 controls a change of the magnetic field (that is, an excited magnetic field) applied on the permeability material portion 124. A same-polarity (NN or SS) repellent magnetic field or an opposite-polarity (NS or SN) attractive magnetic field having a particular magnetic field intensity distribution is applied on adjacent image sensor pixels shown in FIG. 1i, and a repellent force or an attractive force is correspondingly generated between the magnetic poles. The effect of the magnetic force is transferred to the flexible substrate 123 to enable deformation such as extension or contraction of the flexible substrate 123, thereby causing a change to a corresponding pitch between the image sensor pixels, thereby achieving an objective of adjusting a pixel density distribution of an image sensor. In the solution, according to a characteristic of deformation such as extension or contraction of a flexible substrate and a magnetic field control principle, it is implemented that a pixel density distribution on an image sensor is adjustable.

Figure 1J:
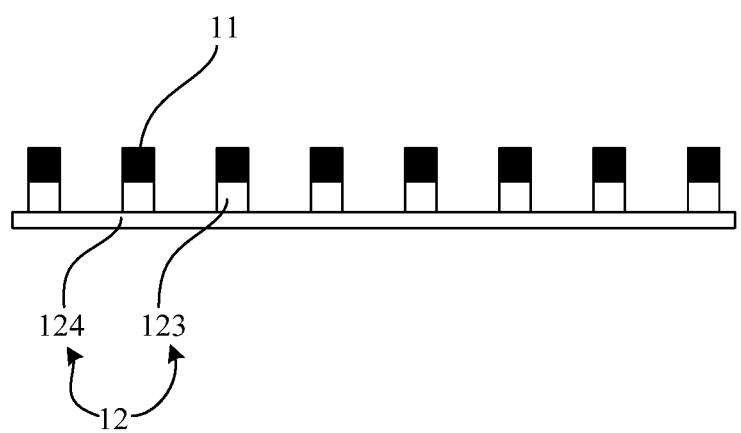
FIG. 1j is a schematic structural diagram of an sensor with an adjustable pixel density according to an embodiment of the subject application.

FIG. 1j is a schematic structural diagram of an eighth image sensor with an adjustable pixel density provided in an embodiment of the subject application. In the image sensor shown in FIG. 1j, the deformation-controllable material portion 12 comprises: a flexible substrate 123 and multiple permeability material portions 124. Surfaces of the multiple permeability material portions 124 are separately connected to the flexible substrate 123, opposite surfaces of the multiple permeability material portions 124 are separately and correspondingly connected to the multiple image sensor pixels 11, a magnetic field applied on the permeability material portion 124 is changed to enable corresponding deformation to occur at the flexible substrate 11, and the deformation is used to correspondingly adjust a density distribution of the multiple image sensor pixels 11. Optionally, the permeability material portion 124 is bonded to the flexible substrate 123, the image sensor pixels 11 is bonded to the permeability material portion 124, and when a magnetic field applied on the permeability material portion 124 is changed, an effect of the magnetic force is transferred to the flexible substrate 123 to enable deformation such as extension or contraction to occur at the flexible substrate 123, thereby achieving an objective of adjusting a pixel density distribution of an image sensor. In the solution, according to a characteristic of deformation such as extension or contraction and a magnetic field control principle, it is implemented that a pixel density distribution on an image sensor is adjustable.

After adjustment of a pixel density distribution is performed on the image sensor according to the target pixel density distribution information, an image of a scene to be photographed is collected by using an actual imaging area of the image sensor. Because an average pixel density of the actual imaging area after adjustment is larger than an average pixel density of the corresponding area before adjustment, in a case of a same digital zoom parameter, the number of pixels of the image sensor after adjustment that participate in image collection is larger, efficiency of image collection is higher, an acquired digital zoom image has higher definition, and details and are richer, thereby better meeting varied application demands of users.

In the embodiments of the subject application, after an image sensor after adjustment of a pixel density distribution performs image collection, the image sensor scans and outputs the acquired image. For example, pixel index information of the actual imaging area may be acquired; and the acquired image may be scanned and output according to the pixel index information. The pixel index information of the image sensor comprises: original position information or pixel index number information of image sensor pixels of the image sensor before adjustment of a pixel density distribution. A scan manner (row-by-row scan, column-by-column scan, interlaced scan, and the like) is used to scan and output the image according to the pixel index information. Because a particular offset exists between actual position information of pixels and corresponding index information of the pixels in a process that the image sensor performs image collection, as compared with an originally collected image, the image that is scanned and output by using the pixel index information is a deformed image having an abnormal display ratio. As compared with the originally collected image, the size of an area corresponding to a large pixel density in the deformed image is larger than that of the area in the originally collected image. For example, a head portion is collected based on an area having a large density of image sensor pixels. In this case, a head portion of a scanned and output deformed image is larger than the head portion in the originally collected image. In this way, a user may see more conveniently a portion that requires special attention of the user, thereby improving efficiency of image presentation and enhancing visual experience of the user.

If a non-deformed image that has a same display portion as that of a preview image needs to be obtained, pixel actual position information of the actual imaging area may be acquired; and the acquired image is scanned and output according to the pixel actual position information, thereby obtaining a restored image that corresponds to the preview image and has a normal display proportion.

A person skilled in the art may understand that in any method in the foregoing of the specific implementation manner of the subject application, the sequence numbers of steps do not mean an execution order, and the execution order of the steps should be determined according to the functions and internal logic of the steps. No limitation should be constituted on implementation processes of the specific implementation manners of the subject application.

FIG. 3 is a logical block diagram of a first imaging control apparatus provided in an embodiment of the subject application. The imaging control apparatus shown in FIG. 3 comprises: a module 31 for acquiring a digital zoom parameter, a module 32 for determining an actual imaging area, a module 33 for adjusting a pixel density distribution, and an image acquisition module 34.

The module 31 for acquiring a digital zoom parameter is for acquiring a digital zoom parameter.

The module 32 for determining an actual imaging area is for determining an actual imaging area of an image sensor according to the acquired digital zoom parameter.

The module 33 for adjusting a pixel density distribution is for adjusting a pixel density distribution of the image sensor, to cause that an average pixel density of the actual imaging area after adjustment is greater than those of other areas of the image sensor.

The image acquisition module 34 is for acquiring, by using the actual imaging area after adjustment, an image of a scene to be photographed.

For the imaging control apparatus provided in the embodiments of the subject application, a pixel density distribution of an image sensor is adjusted according to an actual imaging area corresponding to a digital zoom parameter, to cause that an average pixel density of the actual imaging area of the image sensor is greater than average pixel densities of other areas of the image sensor, that is, the total number of pixels of the actual imaging area of the image sensor after adjustment is greater than the total number of pixels of an area corresponding to the actual imaging area of the image sensor before adjustment, that is, to cause that in a process of imaging control based on a digital zoom technology, the embodiments of the subject application causes that as many as possible pixels of the image sensor gather at the actual imaging area to participate in image collection, thereby improving efficiency of image collection and the definition of a collected image.

A device presentation form of the imaging control apparatus is not limited. For example, the imaging control apparatus may be an independent member, and the member coordinates and communicates with an imaging device comprising an image sensor. Alternatively, the imaging control apparatus may be integrated, as a functional module, in an imaging device comprising an image sensor, which is not limited in the embodiments of the subject application.

Figure 4:
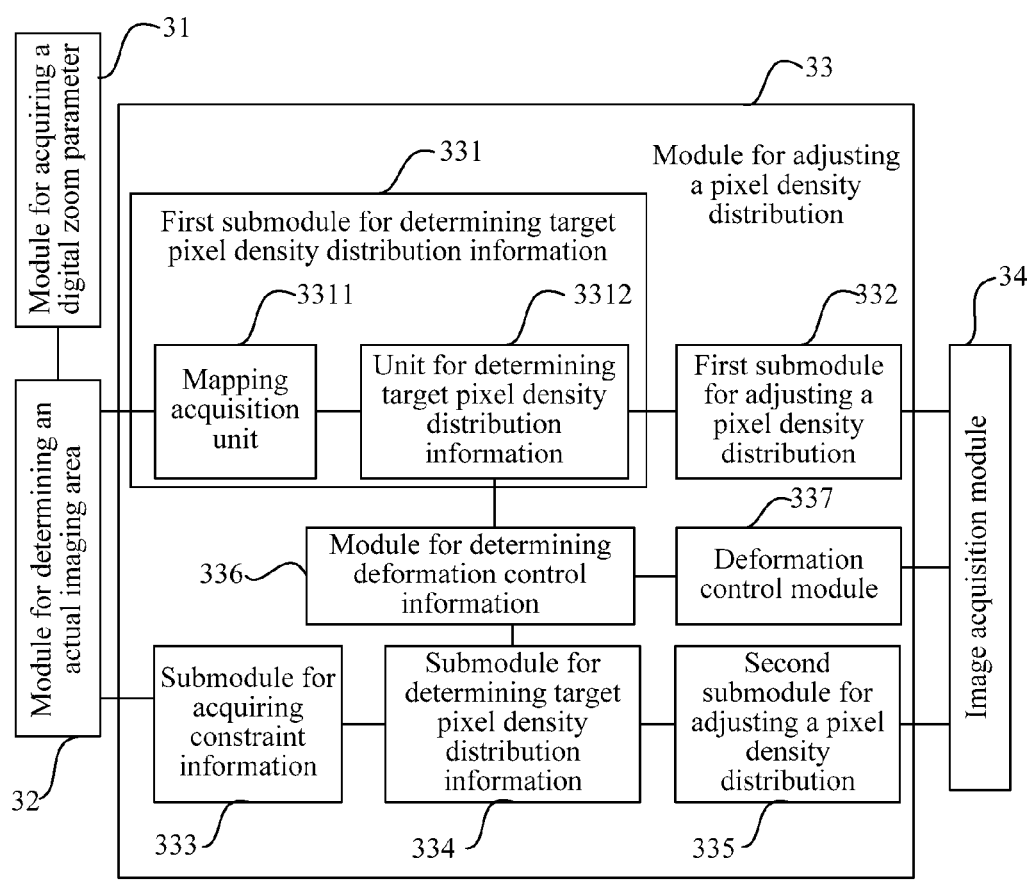
FIG. 4 is a structural block diagram of an imaging control apparatus according to an embodiment of the subject application.

Optionally, as shown in FIG. 4, the module 33 for adjusting a pixel density distribution comprises: a first submodule 331 for determining target pixel density distribution information and a first submodule 332 for adjusting a pixel density distribution. The first submodule 331 for determining target pixel density distribution information is for determining target pixel density distribution information according to the pixel adjustment constraint information and the actual imaging area corresponding to the acquired digital zoom parameter, wherein an average target pixel density corresponding to the actual imaging area in the determined target pixel density distribution information is greater than average target pixel densities corresponding to the other areas; and the first submodule 332 for adjusting a pixel density distribution is for adjusting the pixel density distribution of the image sensor according to the determined target pixel density distribution information. In the solution, the pixel density distribution of the image sensor is adjusted according to the target pixel density distribution information corresponding to the acquired digital zoom parameter, to cause that the pixel density distribution of the image sensor is the same as the target pixel density distribution information, or approximates the target pixel density distribution information, thereby meeting that a high definition image having a corresponding digital zoom effect is obtained under different digital zoom parameters.

Furthermore, the first submodule 331 for determining target pixel density distribution information may comprise: a mapping acquisition unit 3311 and a unit 3312 for determining target pixel density distribution information. The mapping acquisition unit 3311 is for acquiring a mapping between a digital zoom parameter and target pixel density distribution information; and the unit 3312 for determining target pixel density distribution information is for determining, according to the mapping, the target pixel density distribution information corresponding to the acquired digital zoom parameter. The solution helps to improve efficiency of adjusting a pixel density distribution of an image sensor.

Optionally, the module 33 for adjusting a pixel density distribution comprises: a submodule 333 for acquiring constraint information, a submodule 334 for determining target pixel density distribution information, and a second submodule 335 for adjusting a pixel density distribution. The submodule 333 for acquiring constraint information is for acquiring pixel adjustment constraint information of the image sensor; the submodule 334 for determining target pixel density distribution information is for determining target pixel density distribution information according to the pixel adjustment constraint information and the actual imaging area; and the second submodule 335 for adjusting a pixel density distribution is for adjusting the pixel density distribution of the image sensor according to the determined target pixel density distribution information. The solution causes that without damaging an image sensor, a pitch between pixels can be flexibly adjusted within an effective flexible range according to an actual need, thereby better meeting varied actual demands of users.

Optionally, the module for adjusting a pixel density distribution 33 further comprises: a module 336 for determining deformation control information and a deformation control module 337. The module 336 for determining deformation control information is for determining deformation control information of a deformation-controllable material portion according to the determined target pixel density distribution information; and the deformation control module 337 is for controlling deformation of the deformation-controllable material portion according to the deformation control information, so as to correspondingly adjust the pixel density distribution of the image sensor by using the deformation of the deformation-controllable material portion. In the solution, deformation of a deformation-controllable material portion is controlled to adjust a pixel distribution of an image sensor, and the solution is simple and is easy to implement.

Figure 5:
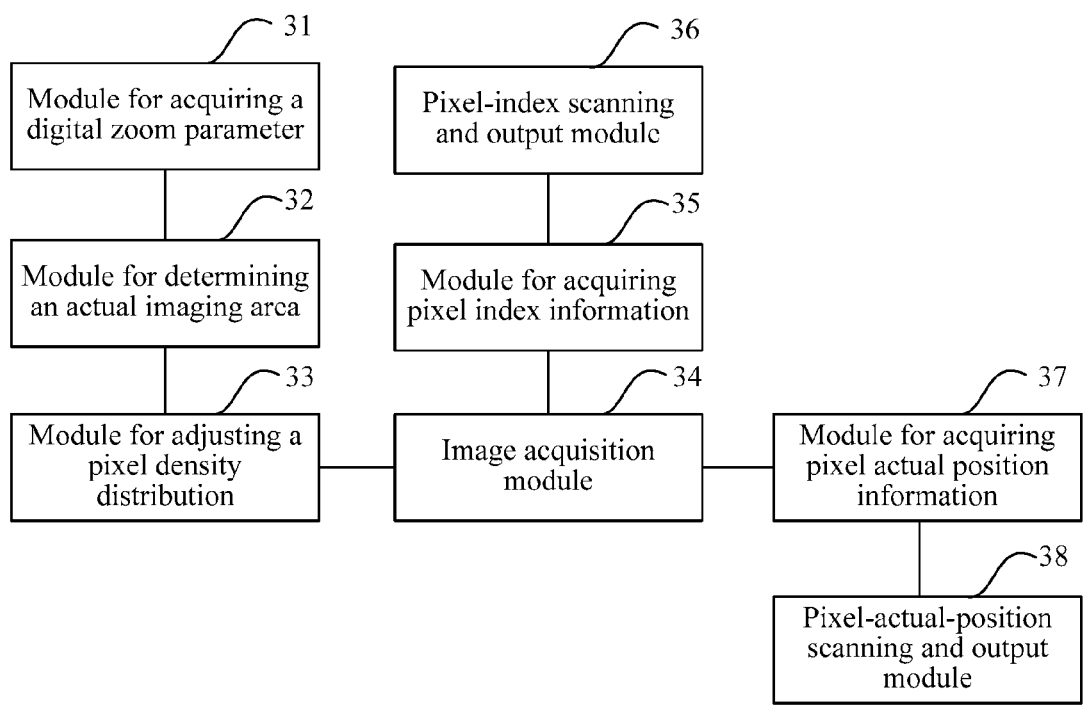
FIG. 5 is a structural block diagram of an imaging control apparatus according to an embodiment of the subject application.

Optionally, as shown in FIG. 5, the imaging control apparatus may further comprise: a module 35 for acquiring pixel index information and a pixel-index scanning and output module 36. The module 35 for acquiring pixel index information is for acquiring pixel index information of the actual imaging area; and the pixel-index scanning and output module 36 is for scanning and outputting the acquired image according to the pixel index information. As compared with an originally collected image, the image that is scanned and output by using the pixel index information is a deformed image having an abnormal display ratio, making it easy for a user to see more conveniently a portion that requires special attention of the user, thereby improving efficiency of image presentation and enhancing visual experience of the user.

Optionally, the imaging control apparatus may further comprise: a module 37 for acquiring pixel actual position information and a pixel-actual-position scanning and output module 38. The module 37 for acquiring pixel actual position information is for acquiring pixel actual position information of the actual imaging area; and the pixel-actual-position scanning and output module 38 is for scanning and outputting the acquired image according to the pixel actual position information. The solution can obtain images that have differentiated distributions of definition and have normal display proportions.

Figure 6:
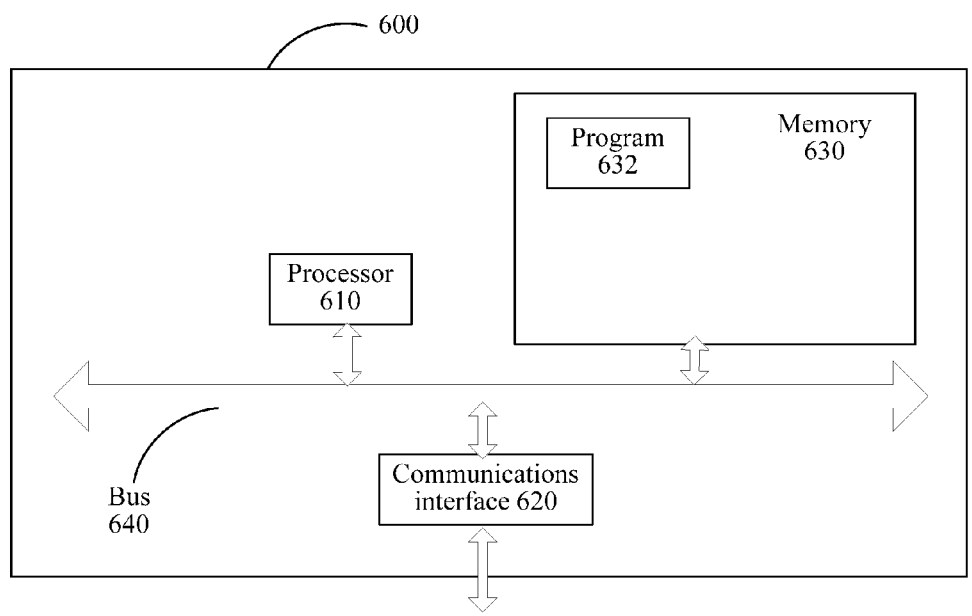
FIG. 6 is a structural block diagram of an imaging control apparatus according to an embodiment of the subject application.

FIG. 6 is a structural block diagram of a fourth imaging control apparatus provided in an embodiment of the subject application. In the subject application, the specific embodiment does not limit a specific implementation manner of an imaging control apparatus 600. As shown in FIG. 6, the imaging control apparatus 600 may comprise:

a processor 610, a communications interface 620, a memory 630, and a communications bus 640.

The processor 610 mutually communicates with the communications interface 620 and the memory 630 by using the communications bus 640.

The communications interface 620 is for communicating with and a device or an external light source having a communication function.

The processor 610 is for executing a program 632, and may specifically execute related steps in the embodiments of any imaging control method for a digital zoom image in the foregoing.

For example, the program 632 may comprise program code, and the program code comprises a computer operation instruction.

The processor 610 may be a central processing unit (CPU), or an application specific integrated circuit (ASIC), or may be configured as one or more integrated circuits that implement the embodiments of the subject application.

The memory 630 is for storing the program 632. The memory 630 may comprise a random access memory (RAM), or may also further comprise a non-volatile memory, for example, at least one disk memory.

For example, in some embodiments, the processor 610 may execute, by executing the program 632, the following steps: acquiring a digital zoom parameter; determining an actual imaging area of an image sensor according to the acquired digital zoom parameter; adjusting a pixel density distribution of the image sensor, to cause that an average pixel density of the actual imaging area after adjustment is greater than those of other areas of the image sensor; and acquiring, by using the actual imaging area after adjustment, an image of a scene to be photographed.

In other optional implementation manners, the processor 610 may further execute, by executing the program 632, steps mentioned in any other embodiments in the foregoing, which are no longer elaborated herein.

Reference may be made to corresponding description of corresponding steps, modules, submodules, and units in the foregoing embodiments for specific implementation of steps in the program 632, which is no longer elaborated herein. A person skilled in the art may clearly understand that for convenience and simplicity of description, reference may be made to the description of corresponding processes in the foregoing method embodiments for the specific working processes of the devices and modules in the foregoing description, which are no longer elaborated herein.

Figure 7:
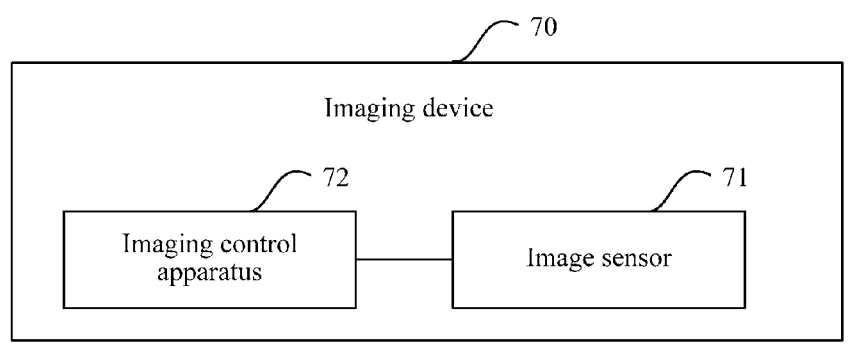
FIG. 7 is a structural block diagram of an imaging device according to an embodiment of the subject application.

FIG. 7 is a logical block diagram of an imaging device provided in an embodiment of the subject application. As shown in FIG. 7, an imaging device 70 provided in the embodiments of the subject application comprises an image sensor 71 and an imaging control apparatus 72. The imaging control apparatus 72 is connected to the image sensor 71. Reference may be made to the records in the above corresponding embodiments for the description of the structure and working principle of the imaging control apparatus, which are no longer elaborated herein. The imaging device may comprise, but is not limited to, a device having an image collection function such as photo taking, video recording, photographing, and video monitoring, for example, may be, but is not limited to, the following devices: a camera, a mobile phone, a camera, a video camera, a video recorder, and the like.

In the technical solution provided in the embodiments of the subject application, a pixel density distribution of an image sensor has been adjusted according to target pixel density distribution information of an image, and the target pixel density distribution information of the image is determined according to target depth of field information of a scene to be photographed. Therefore, an image of the scene to be photographed is acquired according to the image sensor after adjustment, and the definition of different areas of the acquired image presents differentiated distribution corresponding to the target pixel density distribution information. For a part whose target depth of field information needs to be clearly presented, more pixels participate in image collection, and the image of this part has higher definition, thereby improving efficiency of image collection. For a part whose target depth of field information does not need to be clearly presented, relatively fewer pixels participate in image collection, and the image of the part is relatively unclear, thereby generally making full use of pixels of an image sensor to implement an image effect of a small depth of field, thereby better meeting varied application demands of users.

Optionally, the image sensor comprises: multiple image sensor pixels distributed in an array; and a deformation-controllable material portion, separately connected to the multiple image sensor pixels; where the deformation-controllable material portion is deformable under an effect of an external field, and correspondingly adjusts a density distribution of the multiple image sensor pixels by using the deformation; and the external field is controlled by the imaging control apparatus.

The image sensor comprises a flexible substrate and multiple image sensor pixels formed on the flexible substrate, or, reference may be made to the records corresponding to FIG. 1*b* to FIG. 1*j* for the structure of the image sensor, and the imaging control apparatus may directly control the external field to control the deformation of the deformation-controllable material portion, so as to further adjust the pixel density distribution of the image sensor; or, the imaging control apparatus may control the deformation control portion to indirectly control the external field, to cause that corresponding deformation occurs at the deformation-controllable material portion to correspondingly adjust the pixel density distribution of the image sensor; or the like. A physical connection manner between the image sensor pixels and the deformation material portion may be determined according to an actual need, as long as it is met that the pixel density distribution of the image sensor may be adjusted when the deformation material portion deforms, which is not limited in the embodiments of the subject application. Reference may be made to the above corresponding records for specific implementation manners, which are no longer elaborated herein.

In the foregoing embodiments of the subject application, the sequence numbers and/or order of the embodiments are merely for ease of description, but do not represent preference over the embodiments. The description of the embodiments has respective focuses, and for a part that is not described in detail in one embodiment, reference may be made to related description in other embodiments. Reference may be made to the records of the corresponding method embodiments for related description of the implementation principles or processes of related apparatus, device or system embodiments, which are no longer elaborated herein.

A person of ordinary skill in the art may be aware that, in combination with the examples described in the embodiments disclosed in this specification, units and method steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the subject application.

When the functions are implemented in a form of a software functional unit and sold or used as an independent product, the functions may be stored in a computer-readable storage medium. Based on such an understanding, the technical solutions of the subject application essentially, or the part contributing to the existing art, or all or a part of the technical solutions may be implemented in the form of a software product. The software product is stored in a storage medium and comprises several instructions for instructing a computer device (which may be a personal computer, a server, or a network device) or a processor to perform all or a part of the steps of the methods in the embodiments of the subject application. The foregoing storage medium comprises: any medium that can store program code, such as a USB flash drive, a removable hard disk, a read-only memory (ROM), a random access memory (RAM), a magnetic disk, or a light disc.

In the embodiments of the apparatuses, methods, systems, and the like of the subject application, obviously, the members (systems, subsystems, modules, submodules, units, subunits, and the like) or steps may be separated, combined and/or separated and then recombined. These separations and/or recombination should be regarded as equivalent solutions of the subject application. Moreover, in the above description of specific embodiments of the subject application, a feature described and/or shown in one implementation manner may be used in one or more other implementation manners in a same or similar manner, or may be combined with features in other implementation manners, or may be used to replace a feature in another implementation manner.

It should be noted that the terms "comprise/comprising" used herein refer to the existence of features, elements, steps or components, but do not exclude existence or addition of one or more other features, elements, steps or components.

It should be finally noted that the above implementations are only used to describe the subject application, rather than to limit the subject application; various alterations and variations can be made by those of ordinary skill in the art without departing from the spirit and scope of the subject application, so all equivalent technical solutions also belong to the scope of the subject application, and the scope of patent protection of the subject application should be defined by the claims.

What is claimed is:

1. An imaging control method for a digital zoom image implemented by a system comprising a processor, comprising:
    acquiring a digital zoom parameter;
    determining an actual imaging area of an image sensor according to the acquired digital zoom parameter;
    adjusting a pixel density distribution of the image sensor, to cause an average pixel density of the actual imaging area after adjustment to become greater than those of other areas of the image sensor, wherein the image sensor is a flexible image sensor with an adjustable pixel density; and
    acquiring, using the actual imaging area with the adjusted average pixel density, an image of a scene to be photographed.

2. The imaging control method of claim 1, wherein the adjusting a pixel density distribution of the image sensor comprises:
    determining target pixel density distribution information corresponding to the acquired digital zoom parameter, wherein an average target pixel density corresponding to the actual imaging area in the determined target pixel density distribution information becomes greater than average target pixel densities corresponding to the other areas; and
    adjusting the pixel density distribution of the image sensor according to the determined target pixel density distribution information.

3. The imaging control method of claim 2, wherein the determining target pixel density distribution information corresponding to the acquired digital zoom parameter comprises:
    acquiring a mapping between a digital zoom parameter and target pixel density distribution information; and
    determining, according to the mapping, the target pixel density distribution information corresponding to the acquired digital zoom parameter.

4. The imaging control method of claim 1, wherein the adjusting a pixel density distribution of the image sensor comprises:
    acquiring pixel adjustment constraint information of the image sensor;
    determining target pixel density distribution information according to the pixel adjustment constraint information and the actual imaging area; and
    adjusting the pixel density distribution of the image sensor according to the determined target pixel density distribution information.

5. The imaging control method of claim 4, wherein the pixel adjustment constraint information comprises: an adjustable flexible range between any two adjacent pixels of the image sensor.

6. The imaging control method of claim 5, wherein an average pitch between any two adjacent pixels corresponding to the other areas in the target pixel density distribution information is associated with a first value, wherein the first value is greater than a pixel pitch average value of the image sensor and is within the adjustable flexible range.

7. The imaging control method of claim 2, wherein pixels corresponding to the actual imaging area in the target pixel density distribution information are evenly distributed or unevenly distributed.

8. The imaging control method of claim 2, wherein the adjusting the pixel density distribution of the image sensor according to the determined target pixel density distribution information comprises:
    determining deformation control information of a deformation-controllable material portion according to the determined target pixel density distribution information; and
    controlling deformation of the deformation-controllable material portion according to the deformation control information to adjust the pixel density distribution of the image sensor based on the deformation of the deformation-controllable material portion.

9. The imaging control method of claim 8, wherein the deformation-controllable material portion is made of at least one or more of the following deformation-controllable materials: a piezoelectric material, an electroactive polymer, a photo-deformable material, and a magnetostrictive material.

10. The imaging control method of claim 1, further comprising:
    acquiring pixel index information of the actual imaging area; and
    scanning and outputting the acquired image according to the pixel index information.

11. The imaging control method of claim 1, further comprising:
    acquiring pixel actual position information of the actual imaging area; and
    scanning and outputting the acquired image according to the pixel actual position information.

12. An imaging control apparatus, comprising:
    a processor, coupled to a memory, that executes or facilitates execution of executable modules, the executable modules comprising:
    a digital zoom parameter acquisition module configured to acquire a digital zoom parameter;
    an actual imaging area determination module configured to determine an actual imaging area of an image sensor according to the acquired digital zoom parameter;
    a pixel density distribution adjustment module configure to adjust a pixel density distribution of the image sensor, to cause an average pixel density of the actual imaging area after adjustment to become greater than those of other areas of the image sensor, wherein the image sensor is a flexible image sensor with an adjustable pixel density; and
    an image acquisition module configured to acquire, based on the adjusted actual imaging area average pixel density, an image of a scene to be photographed.

13. The imaging control apparatus of claim 12, wherein the pixel density distribution adjustment module comprises:
    a first target pixel density distribution information determination submodule configured to determine the target pixel density distribution information according to the pixel adjustment constraint information and the actual imaging area corresponding to the acquired digital zoom parameter, wherein an average target pixel density corresponding to the actual imaging area in the determined target pixel density distribution information is greater than average target pixel densities corresponding to the other areas; and
a first pixel density distribution adjustment submodule configured to adjust the pixel density distribution of the image sensor according to the determined target pixel density distribution information.

14. The imaging control apparatus of claim 13, wherein the first target pixel density distribution information determination submodule comprises:
a mapping acquisition unit configured to acquire a mapping between a digital zoom parameter and target pixel density distribution information; and
a determination unit configured to determine, according to the mapping, the target pixel density distribution information corresponding to the acquired digital zoom parameter.

15. The imaging control apparatus of claim 12, wherein the pixel density distribution adjustment module comprises:
a constraint information acquisition submodule configured to acquire pixel adjustment constraint information of the image sensor;
a second target pixel density distribution information determination submodule configured to determine the target pixel density distribution information according to the pixel adjustment constraint information and the actual imaging area; and
a second pixel density distribution adjustment submodule configured to adjust the pixel density distribution of the image sensor according to the determined target pixel density distribution information.

16. The imaging control apparatus of claim 12, wherein the pixel density distribution adjustment module further comprises:
a deformation control information determination module configured to determine deformation control information of a deformation-controllable material portion according to the determined target pixel density distribution information; and
a deformation control module configured to control deformation of the deformation-controllable material portion according to the deformation control information and to adjust the pixel density distribution of the image sensor based on the deformation of the deformation-controllable material portion.

17. The imaging control apparatus of claim 12, further comprising:
a pixel index information acquisition module configured to acquire pixel index information of the actual imaging area; and
a pixel-index scanning and output module configured to scan and output the acquired image according to the pixel index information.

18. The imaging control apparatus of claim 12, further comprising:

a pixel actual position information acquisition module configured to acquire pixel actual position information of the actual imaging area; and
a pixel-actual-position scanning and output module configured to scan and output the acquired image according to the pixel actual position information.

19. An imaging device, comprising an image sensor, and the imaging control apparatus of claim 12, wherein the imaging control apparatus is connected to the image sensor.

20. The imaging device of claim 19, wherein the image sensor comprises:
multiple image sensor pixels distributed in an array; and
a deformation-controllable material portion, separately connected to the multiple image sensor pixels; wherein the deformation-controllable material portion is deformable under an effect of an external field, and correspondingly adjusts a density distribution of the multiple image sensor pixels by using the deformation; and the external field is controlled by the imaging control apparatus.

21. A non-transitory computer readable medium that stores at least one executable instruction which, when executed by an apparatus comprising a processor, causes the apparatus to perform an imaging control method, the method comprising:
acquiring a digital zoom parameter;
determining an actual imaging area of an image sensor according to the acquired digital zoom parameter;
adjusting a pixel density distribution of the image sensor, to cause that an average pixel density of the actual imaging area after adjustment is greater than those of other areas of the image sensor, wherein the image sensor is a flexible image sensor with an adjustable pixel density; and
acquiring, using the actual imaging area with the adjusted average pixel density, an image of a scene to be photographed.

22. An imaging control apparatus for a digital zoom image, characterized by comprising a processor and a memory, the memory storing computer executable instructions, the processor being connected to the memory through a communication bus, and when the apparatus for controlling task migration operates, the processor executing the computer executable instructions stored in the memory, so that the apparatus for controlling task migration executes operations, comprising:
acquiring a digital zoom parameter;
determining an actual imaging area of an image sensor according to the acquired digital zoom parameter;
adjusting a pixel density distribution of the image sensor, to cause an average pixel density of the actual imaging area after adjustment to become greater than those of other areas of the image sensor, wherein the image sensor is a flexible image sensor with an adjustable pixel density; and
acquiring, using the actual imaging area with the adjusted average pixel density, an image of a scene to be photographed.

* * * * *